US012804921B2

(12) United States Patent
Tsai

(10) Patent No.: US 12,804,921 B2
(45) Date of Patent: Nov. 17, 2026

(54) MOS CONTROLLED DIODE AND MANUFACTURING METHOD THEREOF

(71) Applicant: LEAP Semiconductor Corp., Taoyuan City (TW)

(72) Inventor: Kuo-Chi Tsai, Taoyuan City (TW)

(73) Assignee: LEAP Semiconductor Corp., Taoyuan City (TW)

( * ) Notice: Subject to any disclaimer, the term of this patent is extended or adjusted under 35 U.S.C. 154(b) by 340 days.

(21) Appl. No.: 18/629,858

(22) Filed: Apr. 8, 2024

(65) Prior Publication Data

US 2024/0363767 A1 Oct. 31, 2024

(30) Foreign Application Priority Data

Apr. 25, 2023 (TW) ................................ 112115292

(51) Int. Cl.
*H10D 8/60* (2025.01)
*H10D 8/01* (2025.01)
(Continued)

(52) U.S. Cl.
CPC ............... *H10D 8/60* (2025.01); *H10D 8/051* (2025.01); *H10D 62/8325* (2025.01); *H10P 30/2042* (2026.01); *H10P 30/21* (2026.01)

(58) Field of Classification Search
CPC ...... H10D 8/051; H10D 8/60; H10D 62/8325; H10P 30/2042; H10P 30/21
See application file for complete search history.

(56) References Cited

U.S. PATENT DOCUMENTS 7,605,017 B2 * 10/2009 Hayashi ............... H10D 62/151 438/188
8,680,619 B2 * 3/2014 Zhu ........................ H10D 64/27 438/176

(Continued)

FOREIGN PATENT DOCUMENTS

CN 102254819 11/2011
CN 102254819 A * 11/2011
CN 109119489 1/2019

OTHER PUBLICATIONS

CN102254819 (Year: 2011).*

(Continued)

*Primary Examiner* — Dale E Page
*Assistant Examiner* — Quovaunda Jefferson
(74) *Attorney, Agent, or Firm* — JCIPRNET

(57) ABSTRACT

A MOS controlled diode (MCD) includes a substrate, an epitaxial layer, a field oxide layer, a plurality of implantation regions, a high-k gate oxide layer, a metal layer, and a metal silicide layer. The epitaxial layer is located on the substrate, the field oxide layer is located on the epitaxial layer, and the field oxide layer has a plurality of field oxide layer openings. The implantation regions are located in the epitaxial layer within the field oxide layer openings. The high-k gate oxide layer is located on the field oxide layer and has a plurality of gate oxide layer openings exposing a portion of the implantation regions. The metal layer covers the high-k gate oxide layer and the gate oxide layer openings to be in direct contact with a portion of the implantation regions. The metal silicide layer is located between each of the implantation regions and the metal layer.

12 Claims, 14 Drawing Sheets

(51) Int. Cl.
*H10D 62/832* (2025.01)
*H10P 30/20* (2026.01)

(56) References Cited

U.S. PATENT DOCUMENTS

| | | | |
|---|---|---|---|
| 2006/0113624 A1 | 6/2006 | Wu |
| 2021/0343835 A1 | 11/2021 | Siemieniec et al. |
| 2022/0157982 A1 | 5/2022 | Chiu et al. |

OTHER PUBLICATIONS

Duck-Soo Kim et al., "A Study on High Performance Lateral Super Barrier Rectifier for Integration in BCD (Bipolar CMOS DMOS) Platform", with English abstract thereof, J. Korean Inst. Electr. Electron. Mater. Eng., Jun. 2015, pp. 371-374.

* cited by examiner

MOS CONTROLLED DIODE AND MANUFACTURING METHOD THEREOF

CROSS-REFERENCE TO RELATED APPLICATION

This application claims the priority benefit of Taiwan application serial no. 112115292, filed on Apr. 25, 2023. The entirety of the above-mentioned patent application is hereby incorporated by reference herein and made a part of this specification.

BACKGROUND OF THE INVENTION

Field of the Invention

The invention relates to a MOS controlled diode technique, and in particular to a MOS controlled diode and a manufacturing method thereof.

Description of Related Art

Semiconductor diodes have two key electrical performance indicators: low turn-on voltage ($V_f$) and low leakage current, and these characteristics are both related to the structure and material of the element.

The general semiconductor diode system adopts the PN junction effect produced by P-type and N-type semiconductor junctions to achieve the effect of rectification. The Schottky diode involves the use of the Schottky effect produced by the junction of metal and semiconductor. Compared with the above diode, the Schottky diode has advantages such as low $V_f$ and fast speed, but also has the issue of larger reverse leakage current.

In order to solve the above issue of larger reverse leakage current, one method is to use silicon carbide instead of silicon as the base material of the element to reduce the reverse leakage current. However, the replacement of this material increases the $V_f$ compared with the original silicon base material element.

In addition, if the gate oxide layer is thinner, the current channel under the gate may be better controlled, and the thickness of the current channel may be increased, so that current conduction efficiency is better. But if too thin, the element may not be able to withstand the reverse bias and cause leakage current.

In addition to the above issues, there is also the issue of current collapse of semiconductor diodes under reverse high voltage that needs to be considered.

SUMMARY OF THE INVENTION

The invention provides a metal oxide semiconductor (MOS) controlled diode and a manufacturing method thereof that may reduce turn-on voltage $V_f$ while maintaining the original low leakage current of an element, therefore saving more power, with lower power consumption, better element conduction performance, and at the same time, the occurrence of current collapse phenomenon is reduced.

A MOS controlled diode of the invention includes a substrate, an epitaxial layer, a field oxide layer, a plurality of implantation regions, a high-k gate oxide layer, a metal layer, and a metal silicide layer. The epitaxial layer is located on the substrate, the field oxide layer is located on the epitaxial layer, and the field oxide layer has a plurality of field oxide layer openings. The implantation regions are located in the epitaxial layer within the field oxide layer openings. The high-k gate oxide layer is located on the field oxide layer and has a plurality of gate oxide layer openings exposing a portion of the implantation regions. The metal layer covers the high-k gate oxide layer and the gate oxide layer openings to be in direct contact with a portion of the implantation regions. The metal silicide layer is located between each of the implantation regions and the metal layer.

In an embodiment of the invention, each of the implantation regions includes: a first implantation region and a second implantation region. The second implantation region is in direct contact with the metal layer, and the first implantation region is deeper and narrower than the second implantation region.

A manufacturing method of a MOS controlled diode of the invention includes providing a substrate, and forming an epitaxial layer on the substrate, and then forming a sacrificial oxide layer having a plurality of sacrificial oxide layer openings on the epitaxial layer to expose a portion of a surface of the epitaxial layer. An ion implantation is then performed to form a plurality of implantation regions in the epitaxial layer within the sacrificial oxide layer openings. Then, the sacrificial oxide layer is removed, and then a field oxide layer is formed on the epitaxial layer, and the field oxide layer has a plurality of field oxide layer openings, and exposes the implantation regions. Next, a metal silicide layer is formed in the epitaxial layer within the field oxide layer openings. Then, an oxide wet etching is performed on the field oxide layer to enlarge a width of each of the field oxide layer openings and expose a portion of the epitaxial layer, and then a high-k gate oxide layer is formed to cover the field oxide layer and extend to a sidewall of the field oxide layer openings, and the high-k gate oxide layer has a plurality of gate oxide layer openings exposing a surface of the metal silicide layer and a portion of the implantation regions, and then a metal layer is formed to cover the high-k gate oxide layer and the gate oxide layer openings, and the metal layer is directly in contact with the implantation regions.

In another embodiment of the invention, a method of forming the metal silicide layer includes comprehensively coating a metal of nickel, forming a metal silicide layer with the metal of nickel and the exposed epitaxial layer in a high-temperature furnace, and then removing the metal nickel not forming the metal silicide layer.

In another embodiment of the invention, the step of the ion implantation includes performing a first implantation step to form a first implantation region in the epitaxial layer within each of the sacrificial oxide layer openings, and then performing an oxide wet etching on the sacrificial oxide layer to enlarge a width of each of the sacrificial oxide layer openings and expose a portion of the epitaxial layer, and then performing a second implantation step to form a second implantation region, wherein the first implantation region is deeper and narrower than the second implantation region.

In all embodiments of the invention, the substrate includes an $N^+$ substrate, and the epitaxial layer includes an $N^-$ epitaxial layer.

In all embodiments of the invention, a dopant of the implantation regions includes aluminum or boron.

In all embodiments of the invention, the substrate and the epitaxial layer are silicon carbide.

In all embodiments of the invention, a dielectric constant of the high-k gate oxide layer is greater than 20.

Based on the above, the structure and method of the invention may more efficiently and accurately form a MOS controlled diode with low leakage current and low $V_f$, and effectively prevent the occurrence of current collapse phenomenon.

In order to make the above features and advantages of the invention more comprehensible, the following specific embodiments are described in detail together with the accompanying drawings.

DESCRIPTION OF THE EMBODIMENTS

Figure 1:
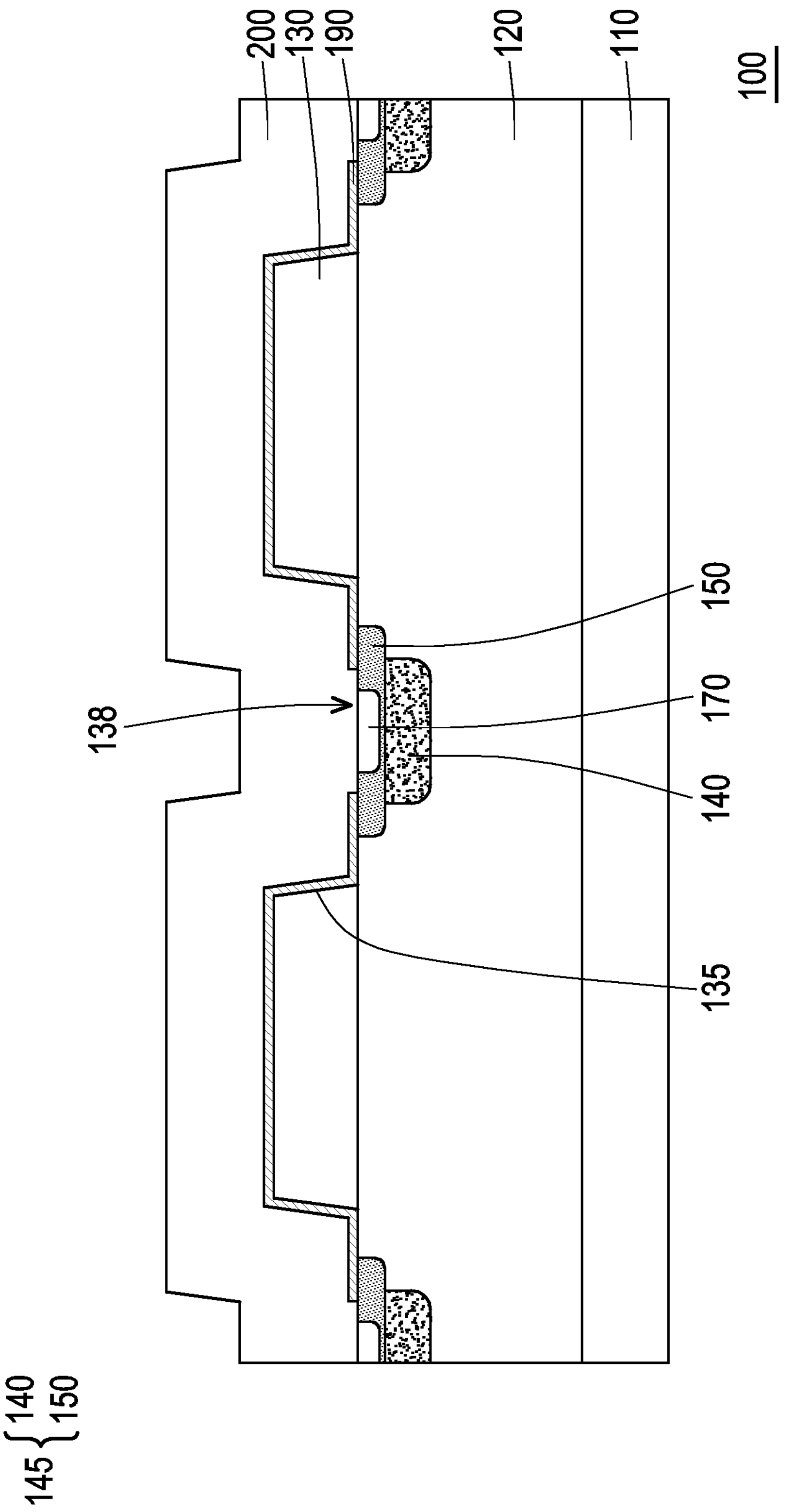
FIG. 1 is a schematic cross-sectional view of a MOS controlled diode according to the first embodiment of the invention.

The following embodiments are listed and described in detail with the accompanying drawings, but the provided embodiments are not intended to limit the scope of the invention. In addition, the drawings are for illustrative purposes only and are not drawn to original scale. In order to facilitate understanding, the same elements in the following description are described with the same reference numerals. In addition, terms such as "containing", "including", and "having" used in the text are all open terms; that is, containing but not limited to. Moreover, the directional terms mentioned in the text, such as: "up", "down", etc., are only used to refer to the directions of the drawings. Accordingly, the directional terms used are for the purpose of description and not to limit the invention.

FIG. 1 is a schematic cross-sectional view of a MOS controlled diode according to the first embodiment of the invention.

Referring to FIG. 1, a MOS controlled diode 100 includes a substrate 110, an epitaxial layer 120, a field oxide layer 130, a plurality of implantation regions 145, a high-k gate oxide layer 190, and a metal layer 200. The epitaxial layer 120 is located on the substrate 110 and usually formed on the substrate 110 by an epitaxial process. The field oxide layer 130 is located on the epitaxial layer 120, and the field oxide layer 130 has a plurality of field oxide layer openings 135, and the field oxide layer openings 135 may be extended in a direction entering the page. The implantation regions 145 are located in the epitaxial layer 120 within the field oxide layer openings 135, and the implantation regions 145 shown in the figure contain a first implantation region 140 and a second implantation region 150, wherein the first implantation region 140 is deeper and narrower than the second implantation region 150; however, the invention is not limited thereto. In another embodiment, if applied to an element having lower voltage, the implantation regions 145 may be the first implantation region 140, and the second implantation region 150 may be omitted. The high-k gate oxide layer 190 is located on the field oxide layer 130 to cover the field oxide layer 130, and the high-k gate oxide layer 190 has a plurality of gate oxide layer openings 138 to expose a portion of the implantation regions 145 so that a channel is formed under the portion where the high-k gate oxide layer 190 and the epitaxial layer 120 are in contact with each other. The metal layer 200 covers the high-k gate oxide layer 190 and the gate oxide layer openings 138 to be in direct contact with the implantation regions 145. More specifically, the metal layer 200 is in direct contact with the portion of the implantation regions 145 not covered by the high-k gate oxide layer 190.

The MOS controlled diode 100 may be a P-type MOS controlled diode or an N-type MOS controlled diode. However, FIG. 1 uses a P-type MOS controlled diode as an example for illustration, and an N-type MOS controlled diode is not excluded.

As shown in FIG. 1, if the MOS controlled diode 100 is P-type, the substrate 110 and the epitaxial layer 120 respectively include an $N^+$ substrate and an $N^-$ epitaxial layer, and the substrate 110 and the epitaxial layer 120 may be silicon carbide with high voltage resistance. The implantation regions 145 are relatively P-type doped, wherein the dopant of the implantation regions 145 may be aluminum, boron, or other suitable dopants. Moreover, if the implantation regions 145 are formed by the first implantation region 140 and the second implantation region 150, the deeper and narrower first implantation region 140 may effectively pinch the current and avoid the occurrence of leakage current phenomenon when the MOS controlled diode 100 is operated in reverse. As for the high-k gate oxide layer 190, a high-k material having a dielectric constant greater than 20 may be used. If compared with silicon dioxide used as the gate dielectric layer, under the same capacitance density, the thickness of the high-k gate oxide layer 190 relative to silicon dioxide is the equivalent oxide thickness (EOT), and the EOT of the high-k gate oxide layer 190 of the present embodiment relative to the 90 Å thick silicon dioxide layer is about 1 Å, or may even reach 1 Å or less, and the material thereof may be a high-k material such as hafnium-containing aluminum oxide. However, the thickness of the high-k gate oxide layer 190 used in the invention may be greater according to process conditions. The metal layer 200 may include AlCu and/or AlSiCu or other suitable metal or alloy materials.

In the MOS controlled diode 100 of the first embodiment, the metal layer 200 is used as a metal gate, and also used as a source in the P-type MOS controlled diode at the same time. The field oxide layer 130 having a certain thickness is between the metal layer 200 and the epitaxial layer 120. The field oxide layer 130 not only may reduce the parasitic capacitance between the source and the drain, but may also be used as a self-aligned oxide block layer of the implantation regions 145 and the high-k gate dielectric layer 190. The detailed process is described below.

When the MOS controlled diode 100 of the first embodiment is applied with a forward bias greater than $V_f$, a current channel is formed between the second implantation region 150 and the first implantation region 140 and flows toward the substrate 110 (cathode); wherein, if the epitaxial layer 120 is silicon carbide, a metal silicide layer 170 may be added between each of the implantation regions 145 and the metal layer 200 to form an ohmic contact effect, wherein the metal silicide layer 170 may be nickel silicide or other suitable metal silicide.

As mentioned above, the invention may be used in a silicon carbide diode, and the thickness of the epitaxial layer 120 is about 5 μm to 6 μm, which may achieve the effect of high voltage resistance. Moreover, a reverse recovery time, trr, of silicon carbide is shorter than that of silicon, so an element using silicon carbide responds faster than an element using silicon. Moreover, the existence of the metal silicide layer 170 enables suitable ohmic contact between the metal layer 200 and the epitaxial layer 120 due to the higher resistance of silicon carbide.

Since the MOS controlled diode 100 of the first embodiment adopts the metal layer 200 as the gate, the Schottky effect occurs after bonding with the semiconductor. Compared with a diode with a PN junction effect produced by simply using P-type and N-type semiconductor junctions, advantages such as low $V_f$ and fast speed are achieved. In addition, using high-voltage silicon carbide as the material of the substrate 110 and the epitaxial layer 120 may further reduce reverse leakage current. Moreover, with the high-k gate oxide layer 190, the gate (the metal layer 200) may more effectively control the current channel thereunder, so as to reduce the negative impact of $V_f$ increase caused by using a silicon carbide substrate. As for the use of the first implantation region 140 and the second implantation region 150, the current may be effectively pinched to avoid the occurrence of leakage current phenomenon during the reverse operation of the MOS controlled diode 100 and suppress the occurrence of current collapse phenomenon, so that the MOS controlled diode 100 may withstand higher voltage, such as 600 V high voltage, and the leakage current thereof may be controlled within 1 μA, and the MOS controlled diode 100 may even be applied to a high-voltage element such as 1200 V to 3000 V. Therefore, the MOS controlled diode 100 manufactured by the invention has a lower $V_f$, and is therefore more power-saving, and also has lower power consumption, better element conduction performance, and at the same time, the occurrence of current collapse phenomenon is reduced.

FIG. 2A to FIG. 2M are schematic cross-sectional views of the manufacturing process of a MOS controlled diode according to the second embodiment of the invention, wherein the same or similar parts and components are represented by the same reference numerals as those in the first embodiment, and the relevant content of the same or similar parts and components is also as provided for the content of the first embodiment, and is not repeated herein.

Figure 2A:
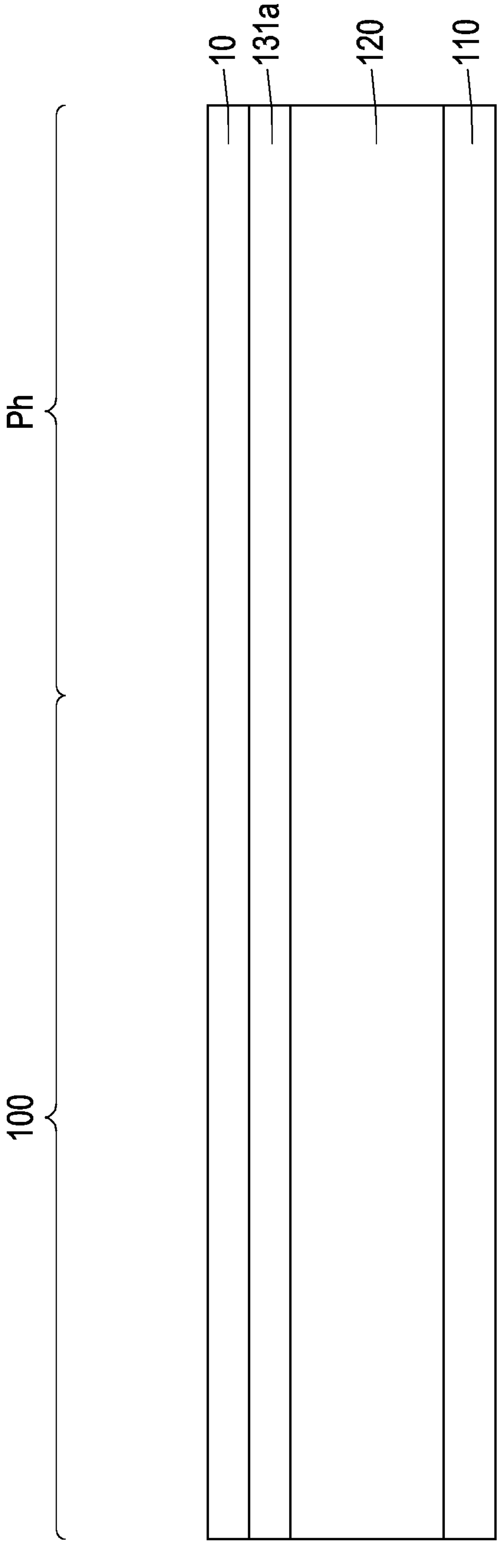
FIG. 2A to FIG. 2M are schematic cross-sectional views of the manufacturing process of a MOS controlled diode according to the second embodiment of the invention.

Referring to FIG. 2A, first, the substrate 110 is provided, including the predetermined MOS controlled diode 100 and the region ph in the periphery of the MOS controlled diode 100. The region ph is used for other purposes, such as disposing a component such as a guard ring. To illustrate the following manufacturing method, the manufacturing method is juxtaposed with the MOS controlled diode 100 at the same time, so as to present the manufacturing process of the second embodiment more clearly. Then, the epitaxial layer 120 is formed on the substrate 110, wherein the substrate 110 and the epitaxial layer 120 may be silicon carbide. In the present embodiment, a P-type MOS controlled diode is taken as an example for illustration, and an N-type MOS controlled diode is not excluded. When the MOS controlled diode 100 is P-type, the substrate 110 and the epitaxial layer 120 are an $N^+$ substrate and an $N^-$ epitaxial layer respectively, wherein the $N^-$ epitaxial layer is formed by doping phosphorus during epitaxy, for example, but the invention is not limited thereto. Next, a sacrificial oxide layer 131*a* is formed on the epitaxial layer 120, and a first photoresist 10 may be coated on the sacrificial oxide layer 131*a* for a subsequent process.

Figure 2B:
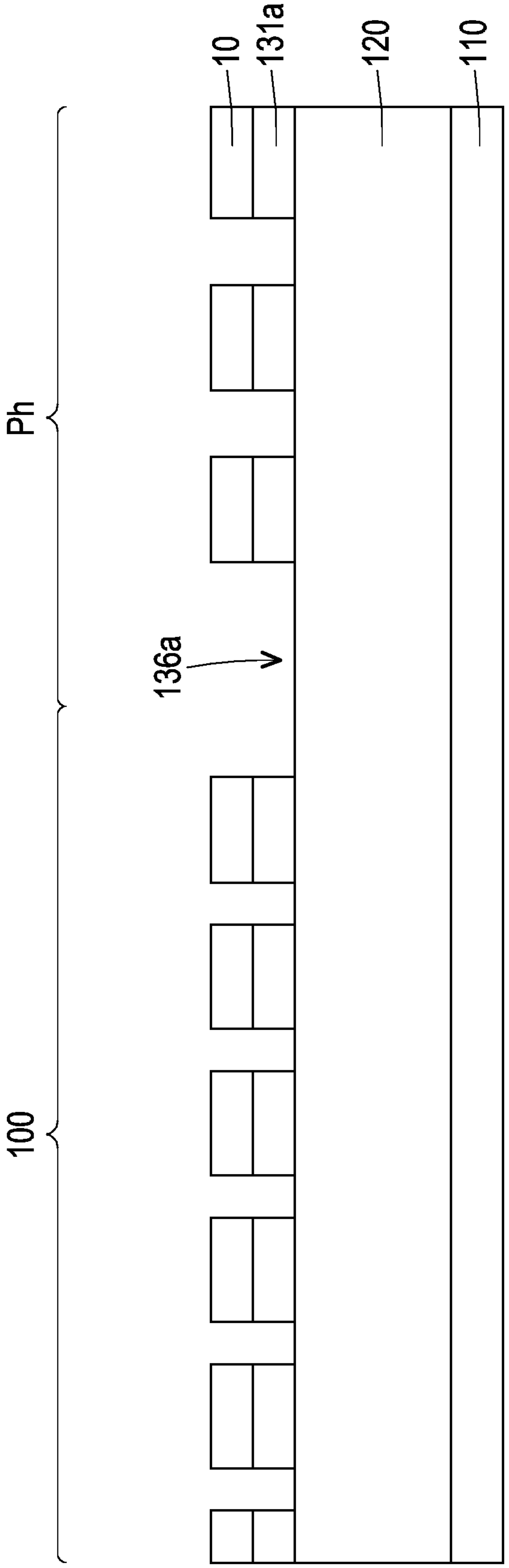

Then, referring to FIG. 2B, the first photoresist 10 is patterned first, and then the patterned first photoresist 10 is used as an etch mask to etch the underlying sacrificial oxide layer 131*a* to form a plurality of sacrificial oxide layer openings 136*a* to expose a portion of the surface of the epitaxial layer 120.

Figure 2C:
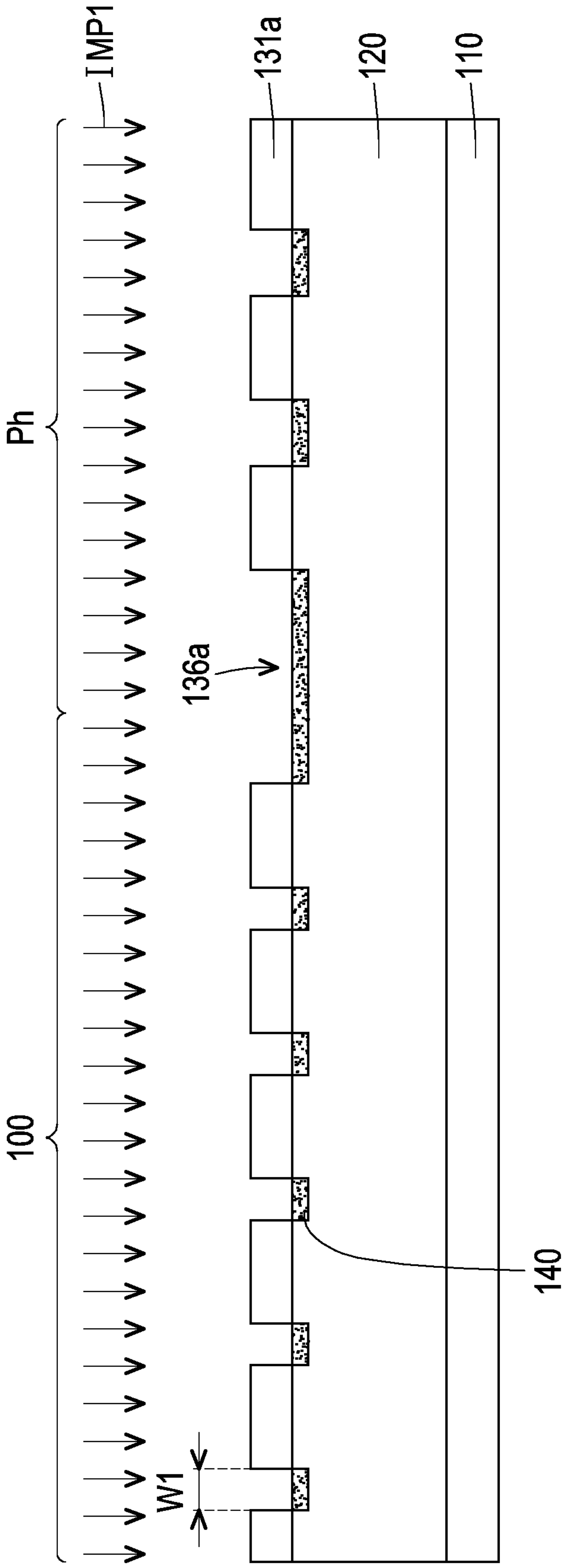

Next, please refer to FIG. 2C, the first photoresist 10 of FIG. 2B is removed. It is particularly noted here that a width W1 of the sacrificial oxide layer openings 136*a* is not a fixed value, but only represents the width W1 of the sacrificial oxide layer openings 136*a* of the sacrificial oxide layer 131*a* after this step, and the widths of the sacrificial oxide layer openings 136*a* at different positions may be the same or different. Then, in order to form a plurality of implantation regions in the epitaxial layer 120 in the sacrificial oxide layer openings 136*a*, a first ion implantation IMP1 is first performed in the present embodiment to form the first implantation region 140 within the epitaxial layer 120 exposed by the sacrificial oxide layer openings 136*a*.

Figure 2D:
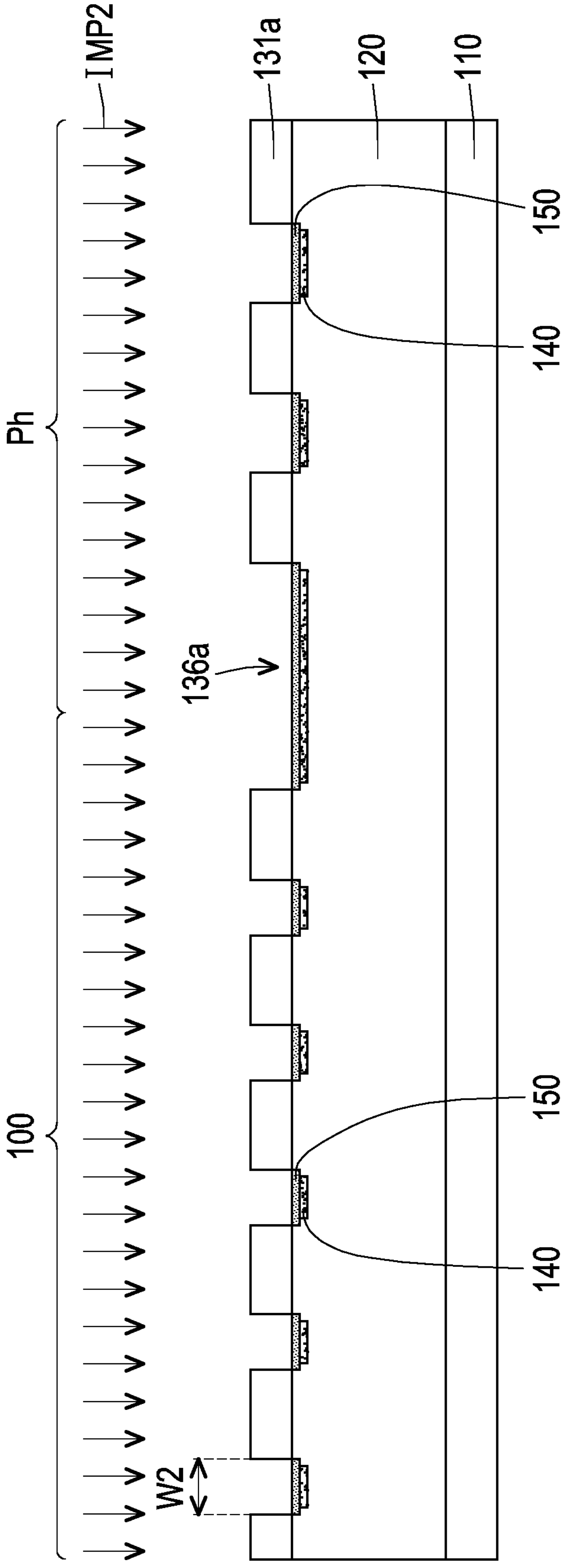

Then, referring to FIG. 2D, a first oxide wet etching is performed on the sacrificial oxide layer 131*a*, so that the width of the sacrificial oxide layer openings 136*a* is increased from the original width (W1 of FIG. 2C) to a width W2, wherein the width W2 is greater than the width W1 by about 2 kÅ, for example. Then, a second ion implantation IMP2 is performed to form the second implantation region 150; at this time, since the sacrificial oxide layer openings 136*a* of the sacrificial oxide layer 131*a* are subjected to the first oxide wet etching, the plane range of the second implantation region 150 is also larger than the plane range of the first implantation region 140. In other words, the first implantation region 140 is deeper and narrower than the second implantation region 150. In addition, the position of the first implantation region 140 in the epitaxial layer 120 is deeper than that of the second implantation region 150. For example, the doping concentrations of the first implantation region 140 and the second implantation region 150 are about 5E12 $cm^{-2}$ respectively. In addition, the first implantation region 140 and the second implantation region 150 within the region ph may serve as a guard ring.

When the substrate 110 and the epitaxial layer 120 are silicon carbide, the dopant of the first ion implantation IMP1 and the second ion implantation IMP2 may be a P-type dopant such as aluminum or boron.

Figure 2E:
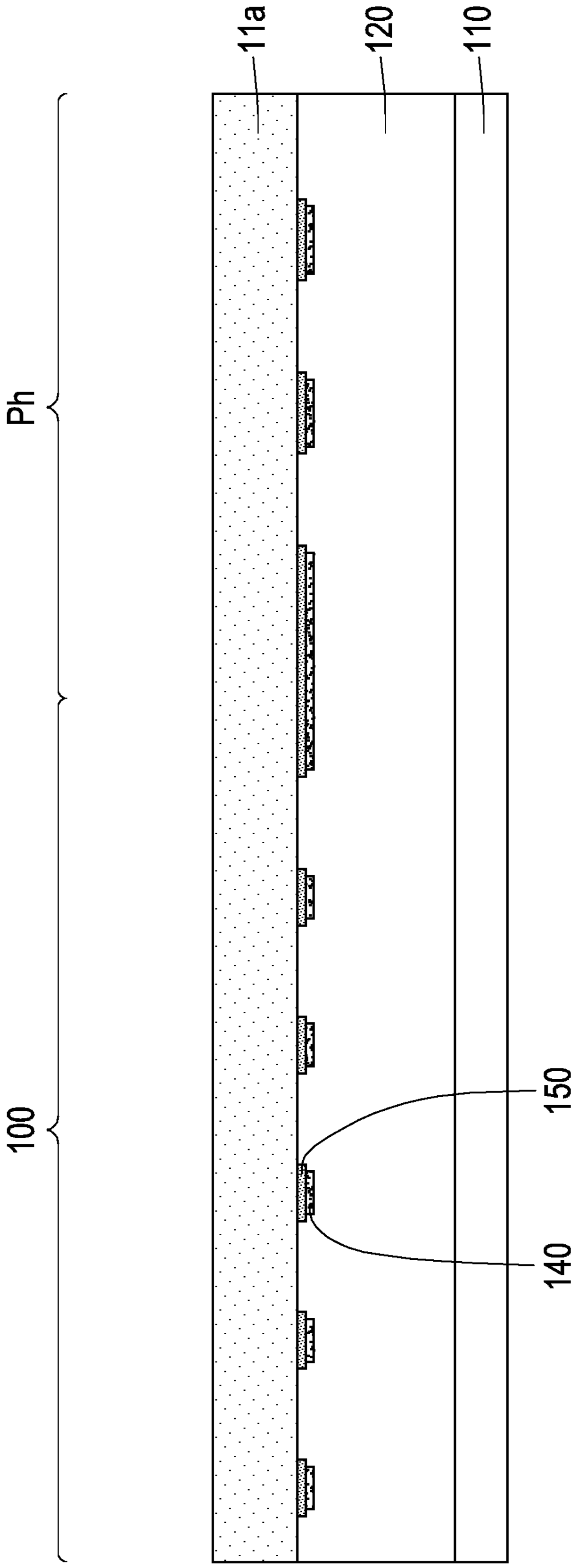

Next, please refer to FIG. 2E, if the dopant of the first ion implantation IMP1 and the second ion implantation IMP2 is aluminum, after the sacrificial oxide layer 131*a* in FIG. 2D is removed, a second photoresist 11*a* is comprehensively coated, and after the second photoresist 11*a* is baked to form a carbon film, the aluminum dopant is activated.

Figure 2F:
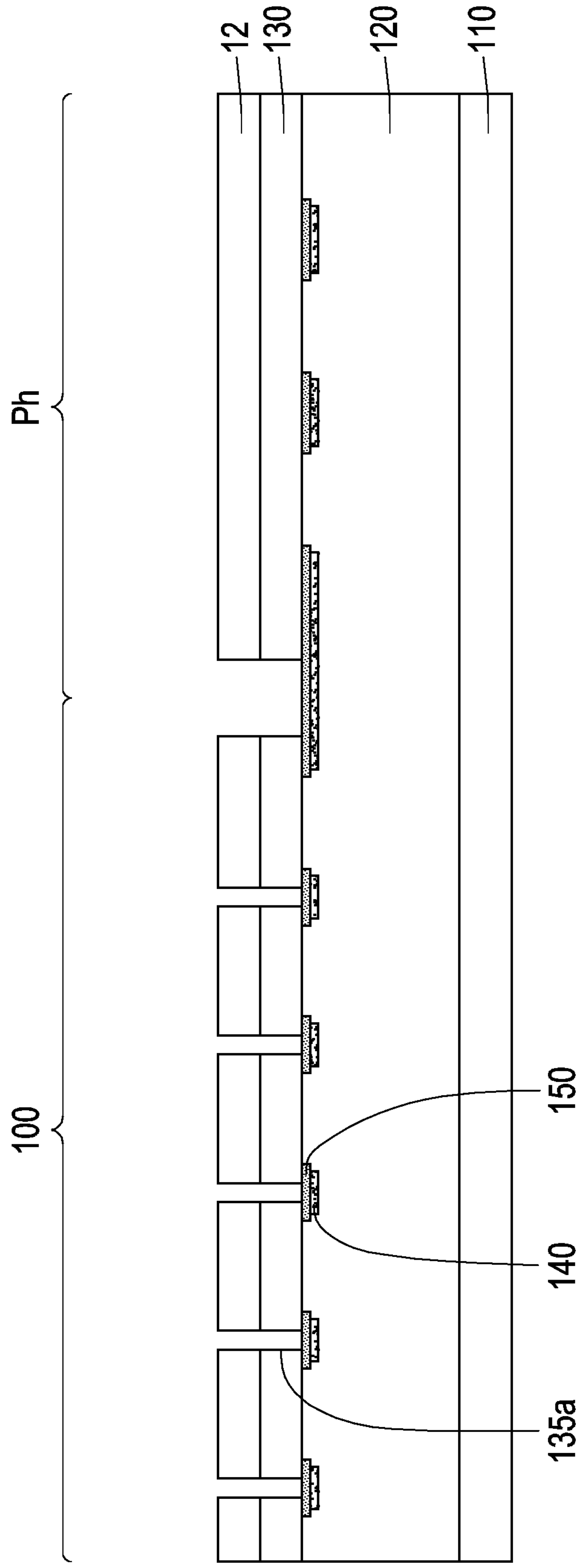

Then, please refer to FIG. 2F, the carbon film of the second photoresist 11*a* of FIG. 2E is removed first, then the field oxide layer 130 is comprehensively formed thereon, and a third photoresist 12 is coated on the field oxide layer 130. Then, the third photoresist 12 is patterned first, and then using the patterned third photoresist 12 as an etch mask, the underlying field oxide layer 130 is etched to form a plurality of field oxide layer openings 135*a* and expose the second implantation region 150.

Figure 2G:
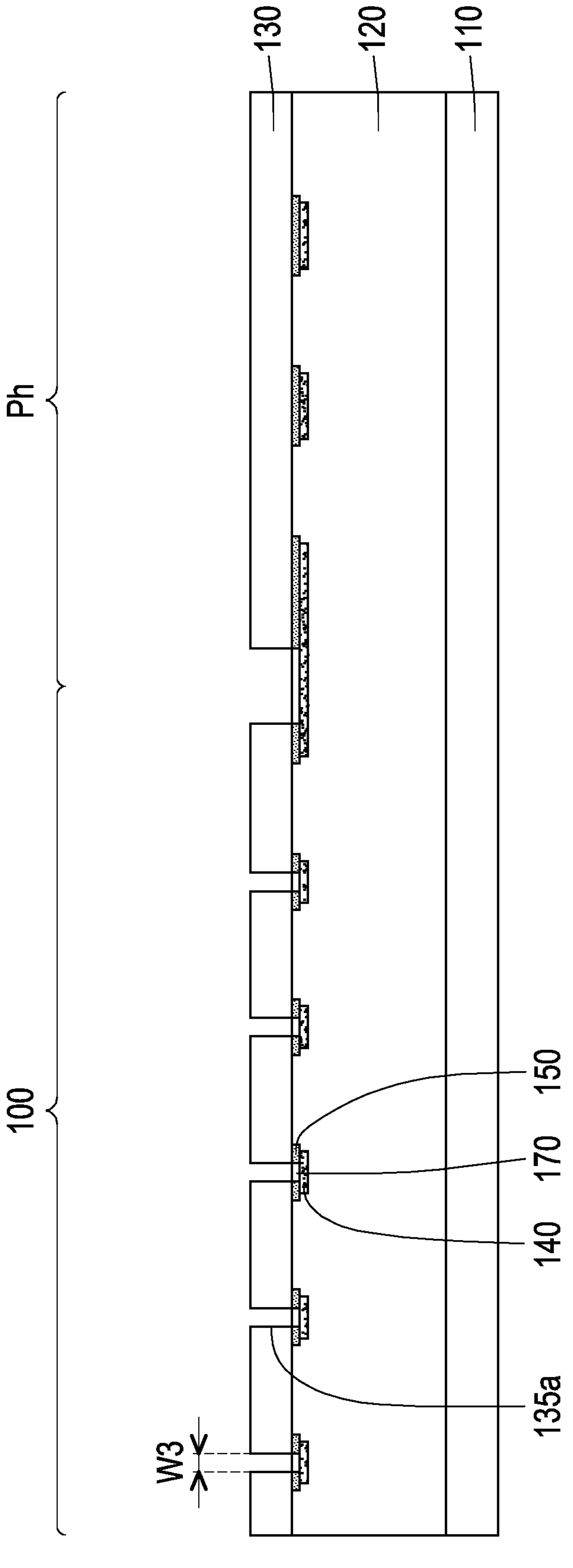

Next, please refer to FIG. 2G, after the third photoresist 12 is removed, a layer of metal nickel (not shown) may be comprehensively coated before entering a high-temperature furnace to allow the metal nickel and the exposed epitaxial layer 120 to form the metal silicide layer 170. Then, aqua regia is used to remove the nickel metal not forming the silicide. At this time, since a width W3 of the field oxide layer openings 135*a* is less than the width W1 of the sacrificial oxide layer openings 136*a* of FIG. 2C, the forming range of the metal silicide layer 170 is narrower.

Figure 2H:
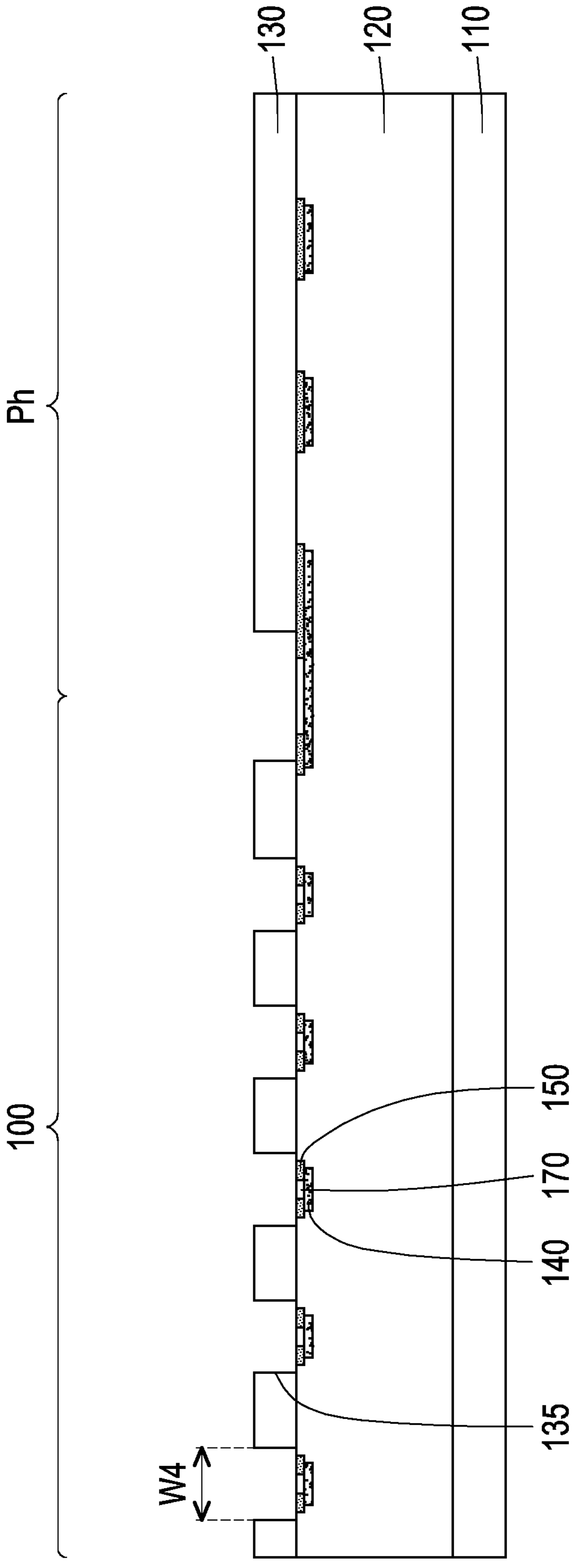

Subsequently, referring to FIG. 2H, a second oxide wet etching is performed on the field oxide layer 130, so that the width of the field oxide layer openings 135 is increased from the original width (W3 of FIG. 2G) to a width W4, wherein the width W4 is, for example, about 4 kÅ larger than the width W3.

Figure 2I:
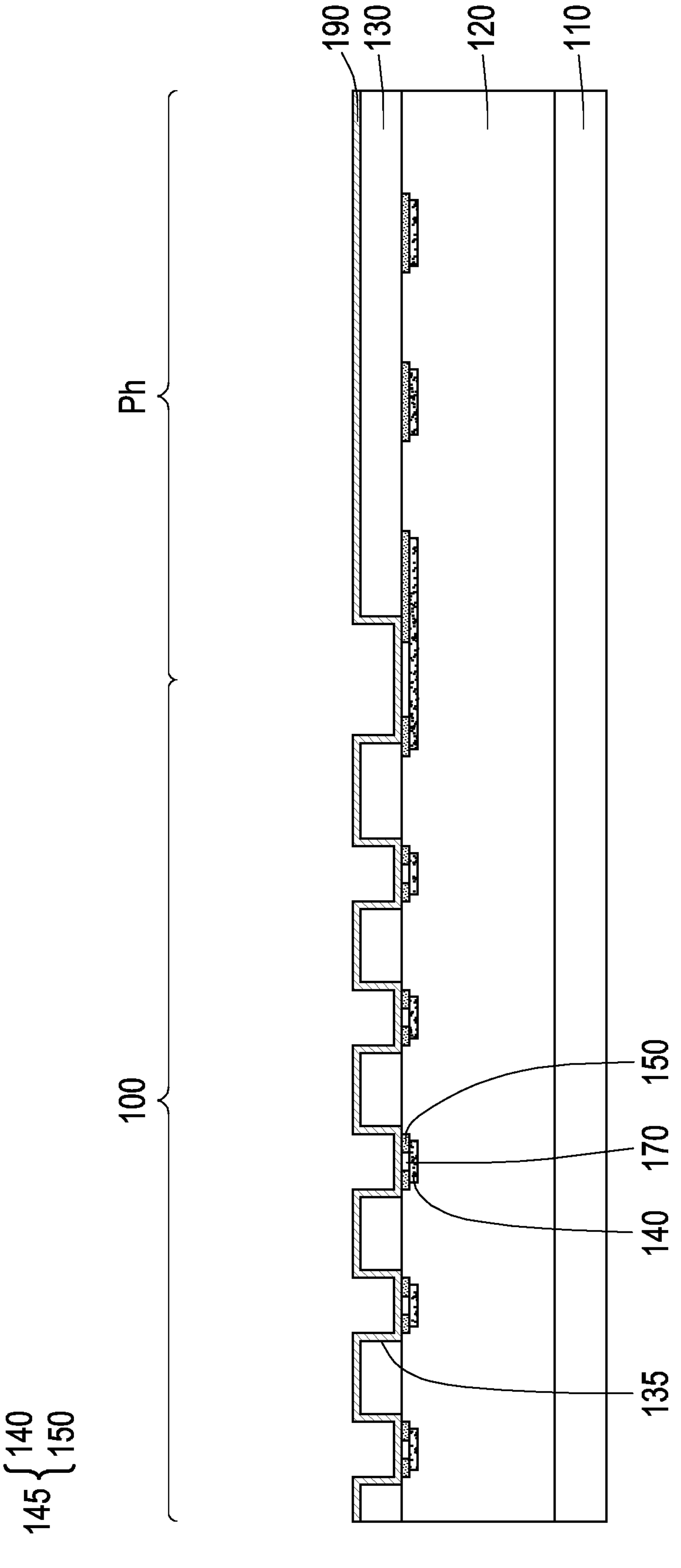

Then, referring to FIG. 2I, the high-k gate oxide layer 190 is formed to cover the field oxide layer 130 and be extended to the sidewall of the field oxide layer openings 135, the surface of the epitaxial layer 120, and on the implantation regions 145. The high-k gate oxide layer 190 is formed by a technique such as atomic layer deposition (ALD). The dielectric constant of the high-k gate oxide layer 190 is, for example, 4 or more, preferably 20 or more, and the material thereof is, for example, aluminum oxide containing hafnium (Hf). However, the material is not limited thereto. If hafnium oxide containing hafnium is used, the crystallization uniformity of the material is better, and therefore reduction of the incidence of leakage current may be promoted. However, the invention is not limited thereto. The material of the high-k gate oxide layer 190 may also be selected from other suitable high-k gate oxides.

Figure 2J:
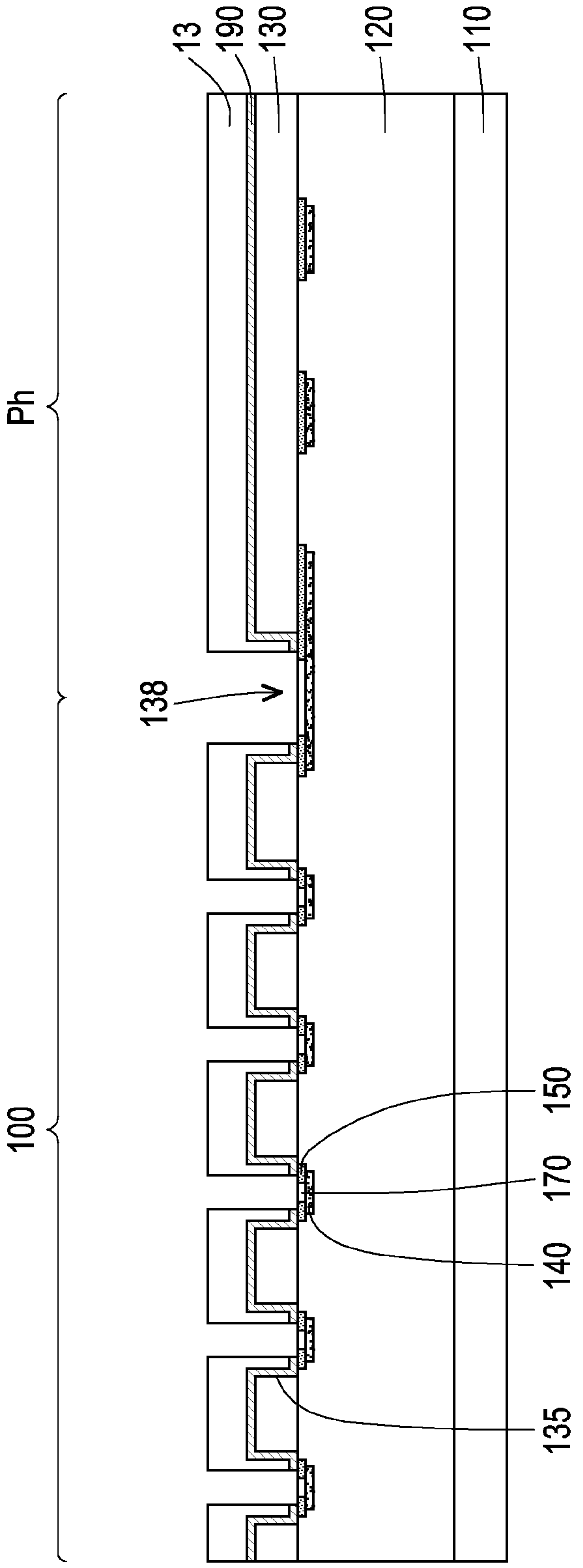

Next, referring to FIG. 2J, a patterned fourth photoresist 13 is first formed on the high-k gate oxide layer 190 by a lithography process to expose the region where metal contact is to be made. Then, using the fourth photoresist 13 as an etch mask, the underlying high-k gate oxide layer 190 is etched until the surface of the metal silicide layer 170 and a portion of the second implantation region 150 is exposed to form the gate oxide layer openings 138.

Figure 2K:
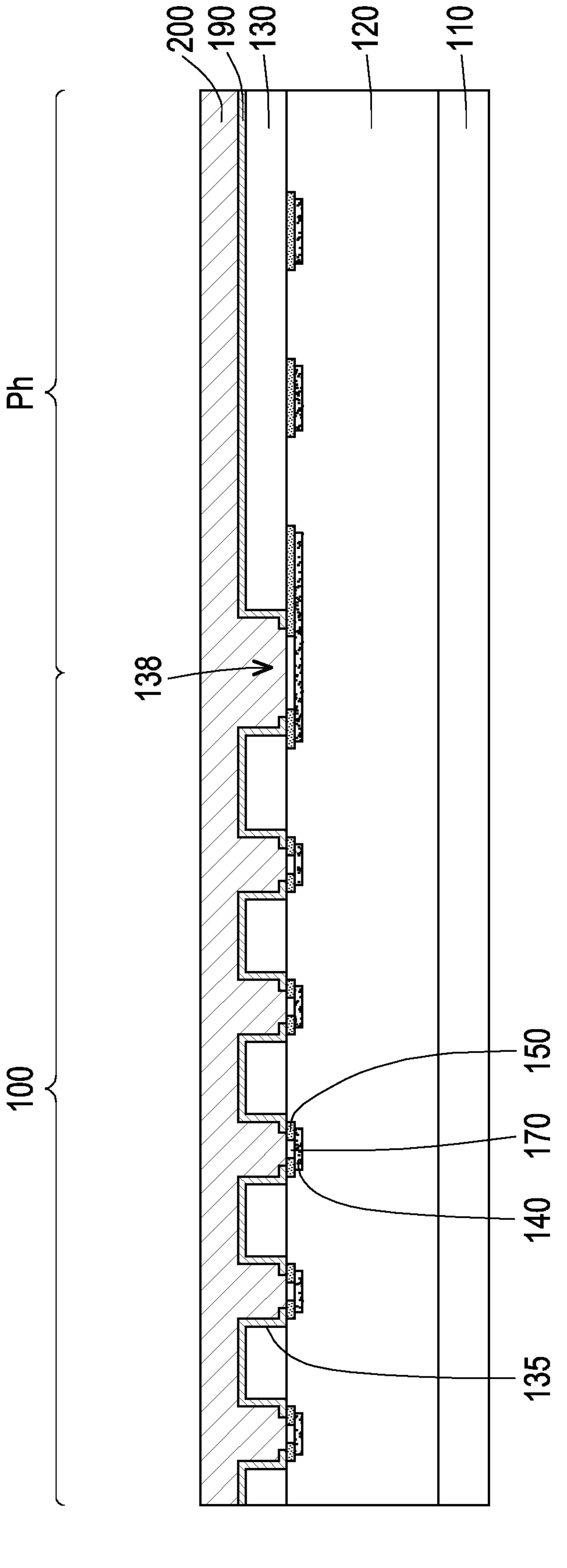

Next, referring to FIG. 2K, a metal layer 200 is formed to cover the high-k gate oxide layer 190 and the gate oxide layer openings 138, and the metal layer 200 is in direct contact with the second implantation region 150, wherein the metal layer 200 is, for example, AlCu, AlSiCu, etc., and the metal layer 200 may be formed by sputtering, but the invention is not limited thereto.

Figure 2L:
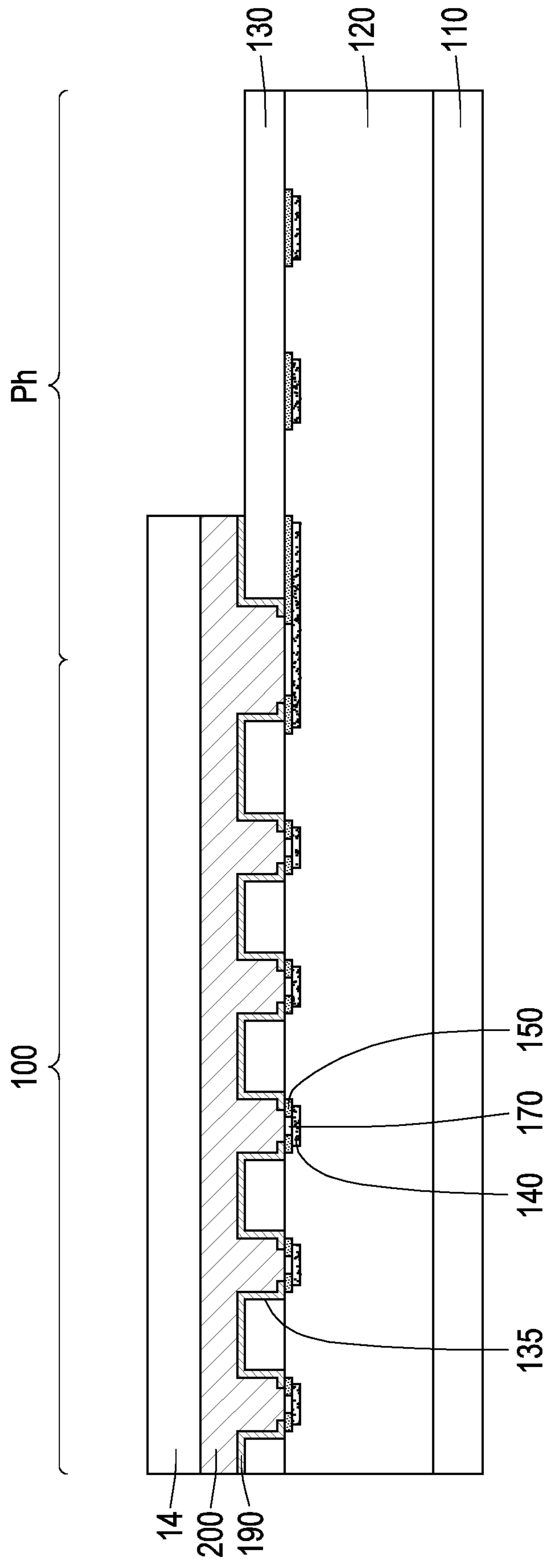

Then, referring to FIG. 2L, a patterned fifth photoresist 14 is first formed on the metal layer 200 by a lithography process to expose the metal layer 200 of a portion of the region ph. Then, using the fifth photoresist 14 as an etch mask, the underlying metal layer 200 is etched until the field oxide layer 130 is exposed.

Figure 2M:
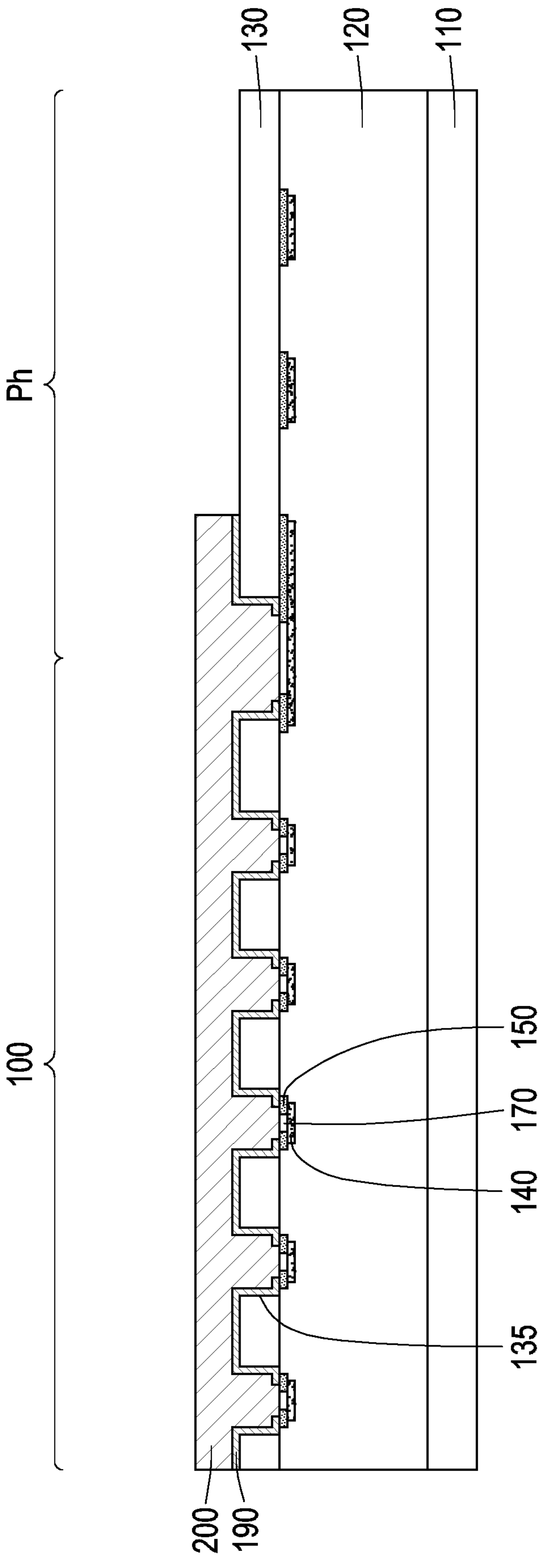

Next, referring to FIG. 2M, the fifth photoresist 14 is removed. That is, the manufacture of the chip is completed.

Except for the necessary steps, the above steps may be more or less according to the requirements, and the adopted process and method may also be replaced with existing techniques, and are not limited to the above content.

Although the invention has been disclosed above with the embodiments, the embodiments are not intended to limit the invention. Anyone having ordinary skill in the art may make some changes and modifications without departing from the spirit and scope of the invention. Therefore, the scope of the invention should be defined by the scope of the appended claims.

What is claimed is:

1. A metal oxide semiconductor (MOS) controlled diode, comprising:
- a substrate;
- an epitaxial layer located on the substrate;
- a field oxide layer located on the epitaxial layer, and the field oxide layer has a plurality of field oxide layer openings;
- a plurality of implantation regions located in the epitaxial layer within the field oxide layer openings;
- a high-k gate oxide layer located on and covering the field oxide layer, the high-k gate oxide layer extends to a sidewall of the field oxide layer openings, and the high-k gate oxide layer has a plurality of gate oxide layer openings exposing a portion of the plurality of implantation regions;
- a metal layer covering the high-k gate oxide layer and the gate oxide layer openings to be in direct contact with a portion of the plurality of implantation regions; and
- a metal silicide layer located between each of the plurality of implantation regions and the metal layer, wherein the plurality of gate oxide layer openings expose a surface of the metal silicide layer.

2. The MOS controlled diode of claim 1, wherein the substrate comprises an $N^+$ substrate, and the epitaxial layer comprises an $N^-$ epitaxial layer.

3. The MOS controlled diode of claim 1, wherein the substrate and the epitaxial layer are silicon carbide.

4. The MOS controlled diode of claim 3, wherein a dopant of the implantation regions comprises aluminum or boron.

5. The MOS controlled diode of claim 1, wherein each of the implantation regions comprises:
- a first implantation region; and
- a second implantation region in direct contact with the metal layer, and the first implantation region is deeper and narrower than the second implantation region.

6. The MOS controlled diode of claim 1, wherein a dielectric constant of the high-k gate oxide layer is greater than 20.

7. A manufacturing method of a MOS controlled diode, comprising:
- providing a substrate;
- forming an epitaxial layer on the substrate;
- forming a sacrificial oxide layer on the epitaxial layer, and the sacrificial oxide layer has a plurality of sacrificial oxide layer openings exposing a portion of a surface of the epitaxial layer;
- performing an ion implantation to form a plurality of implantation regions in the epitaxial layer within the plurality of sacrificial oxide layer openings;
- removing the sacrificial oxide layer;
- forming a field oxide layer on the epitaxial layer, and the field oxide layer has a plurality of field oxide layer openings exposing the plurality of implantation regions;
- forming a metal silicide layer in the epitaxial layer within the plurality of field oxide layer openings;
- performing a first oxide wet etching on the field oxide layer to enlarge a width of each of the field oxide layer openings and expose a portion of the epitaxial layer;
- forming a high-k gate oxide layer covering the field oxide layer and extended to a sidewall of the plurality of field oxide layer openings, and the high-k gate oxide layer has a plurality of gate oxide layer openings exposing a surface of the metal silicide layer and a portion of the plurality of implantation regions; and
- forming a metal layer to cover the high-k gate oxide layer and the plurality of gate oxide layer openings, and the metal layer is in direct contact with the plurality of implantation regions.

8. The manufacturing method of the MOS controlled diode of claim 7, wherein the substrate and the epitaxial layer are carbonized into silicon carbide.

9. The manufacturing method of the MOS controlled diode of claim 8, wherein a method of forming the metal silicide layer comprises:
- comprehensively coating a metal nickel;
- forming the metal silicide layer using the metal nickel and the exposed epitaxial layer in a high-temperature furnace; and
- removing the metal nickel not forming the metal silicide layer.

10. The manufacturing method of the MOS controlled diode of claim 8, wherein the dopant of the ion implantation comprises aluminum or boron.

11. The manufacturing method of the MOS controlled diode of claim 7, wherein the step of the ion implantation comprises:

performing a first implantation step to form a first implantation region in the epitaxial layer within each of the sacrificial oxide layer openings;

performing a second oxide wet etching on the sacrificial oxide layer to enlarge a width of each of the sacrificial oxide layer openings and expose a portion of the epitaxial layer; and performing a second implantation step to form a second implantation region, wherein the first implantation region is deeper and narrower than the second implantation region.

12. The manufacturing method of the MOS controlled diode of claim 7, wherein a dielectric constant of the high-k gate oxide layer is greater than 20.

* * * * *